United States Patent
Behringer et al.

(10) Patent No.: US 10,854,784 B2
(45) Date of Patent: Dec. 1, 2020

(54) METHOD FOR ESTABLISHING ELECTRICAL CONTACT OF A SEMICONDUCTOR LAYER AND SEMICONDUCTOR COMPONENT HAVING ELECTRICAL CONTACT

(71) Applicant: OSRAM Opto Semiconductors GmbH, Regensburg (DE)

(72) Inventors: Martin Rudolf Behringer, Regensburg (DE); Brendan Holland, Regensburg (DE); Jana Sommerfeld, Regensburg (DE); Sabine vom Dorp, Altdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/331,121

(22) PCT Filed: Sep. 26, 2017

(86) PCT No.: PCT/EP2017/074398
§ 371 (c)(1),
(2) Date: Mar. 6, 2019

(87) PCT Pub. No.: WO2018/060206
PCT Pub. Date: Apr. 5, 2018

(65) Prior Publication Data
US 2019/0229241 A1    Jul. 25, 2019

(30) Foreign Application Priority Data
Sep. 27, 2016 (DE) .................. 10 2016 118 241

(51) Int. Cl.
*H01L 33/38* (2010.01)
*H01L 33/42* (2010.01)
(Continued)

(52) U.S. Cl.
CPC .......... *H01L 33/387* (2013.01); *H01L 33/382* (2013.01); *H01L 33/42* (2013.01);
(Continued)

(58) Field of Classification Search
CPC ..... H01L 33/382; H01L 33/387; H01L 33/40; H01L 33/42; H01L 33/44
See application file for complete search history.

(56) References Cited

U.S. PATENT DOCUMENTS 7,446,341 B2 * 11/2008 Bader ................... H01L 33/387
257/79
8,928,052 B2    1/2015 Engl et al.
(Continued)

FOREIGN PATENT DOCUMENTS

| DE | 10244986 A1 | 4/2004 |
| WO | 2009121319 A | 10/2009 |
| WO | 2013045574 A1 | 4/2013 |

*Primary Examiner* — Joseph M Galvin, III
(74) *Attorney, Agent, or Firm* — Slater Matsil, LLP

(57) ABSTRACT

A method for producing an electrical contact on a semiconductor layer and a semiconductor component having an electrical contact are disclosed. In an embodiment a method includes providing a semiconductor layer, forming a plurality of contact rods on the semiconductor layer, wherein the contact rods are formed by a first material and a second material, wherein the first material is applied to the semiconductor layer and the second material is applied to the first material, and wherein a lateral structure of the first material is self-organized, forming a filling layer on the contact rods and in intermediate spaces between the contact rods and exposing the contact rods.

16 Claims, 5 Drawing Sheets

(51) Int. Cl.
 *H01L 33/44* (2010.01)
 *H01L 33/40* (2010.01)
(52) U.S. Cl.
 CPC .............. *H01L 33/44* (2013.01); *H01L 33/40* (2013.01); *H01L 2933/0016* (2013.01)

(56) References Cited

U.S. PATENT DOCUMENTS

| | | | |
|---|---|---|---|
| 2006/0086942 | A1 | 4/2006 | Wu et al. |
| 2009/0057653 | A1* | 3/2009 | Lee ................... H01L 29/0673 257/37 |
| 2010/0171135 | A1* | 7/2010 | Engl ...................... H01L 33/58 257/98 |
| 2012/0161600 | A1* | 6/2012 | Norris ................... G02B 5/008 313/11 |
| 2013/0248877 | A1 | 9/2013 | Fujikane et al. |
| 2014/0283903 | A1 | 9/2014 | von Malm et al. |

* cited by examiner

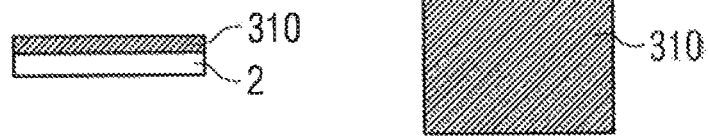
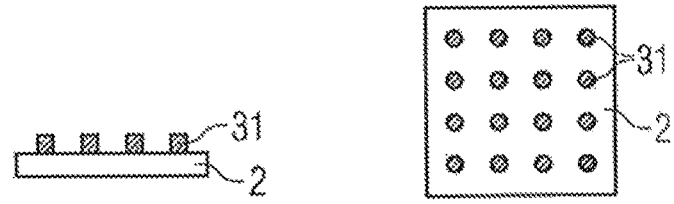
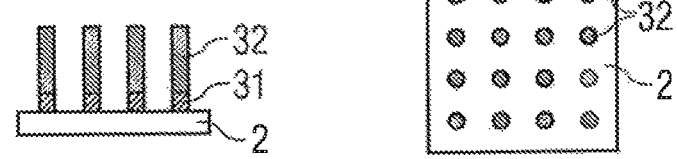
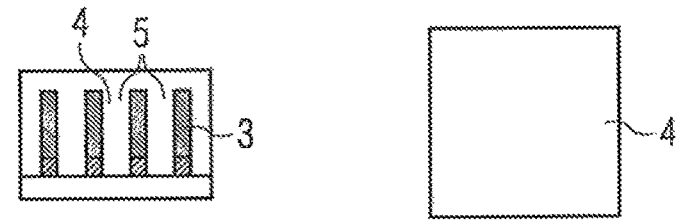
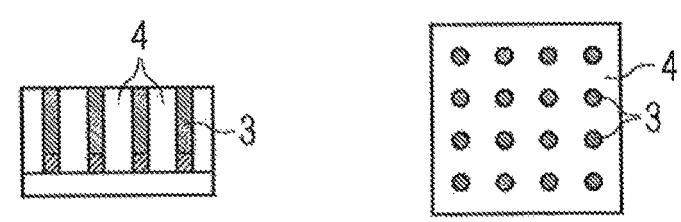
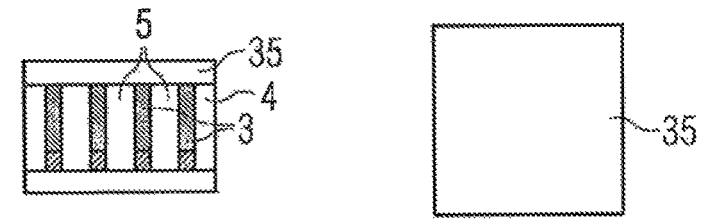

FIG 3A
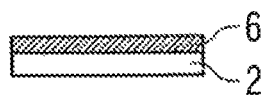 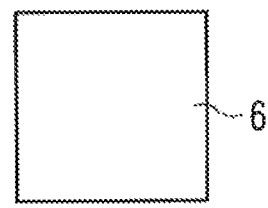
FIG 3B
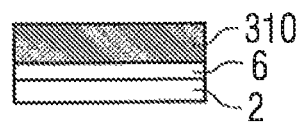 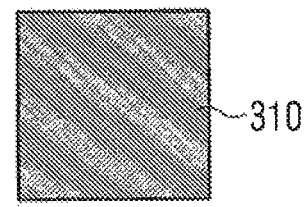
FIG 3C
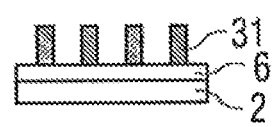 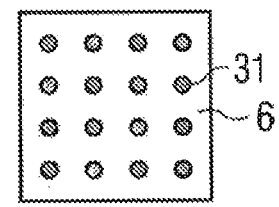
FIG 3D
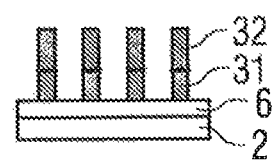 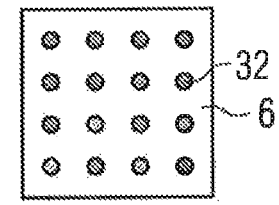
FIG 3E
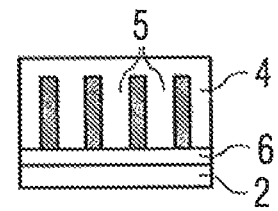 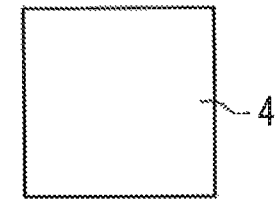
FIG 3F
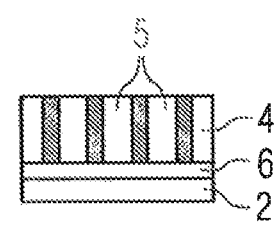 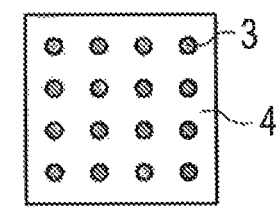

METHOD FOR ESTABLISHING ELECTRICAL CONTACT OF A SEMICONDUCTOR LAYER AND SEMICONDUCTOR COMPONENT HAVING ELECTRICAL CONTACT

This patent application is a national phase filing under section 371 of PCT/EP2017/074398, filed Sep. 26, 2017, which claims the priority of German patent application 102016118241.9, filed Sep. 27, 2016, each of which is incorporated herein by reference in its entirety.

TECHNICAL FIELD

The present application relates to a method for producing an electrical contact on a semiconductor layer and a semiconductor component with an electrical contact.

BACKGROUND

With optoelectronic semiconductor components such as light-emitting diodes, for example, electrical contact is often desired which enables a uniform charge carrier distribution in the lateral direction and at the same time shows low absorption losses. For example, transparent conductive oxides (TCO) are used, which are applied to the semiconductor layer to be contacted. However, such materials can also cause radiation absorption that cannot be neglected.

SUMMARY OF THE INVENTION

Embodiments provide a method, with which an electrical contact of a semiconductor component can be achieved with low absorption losses and at the same time an efficient charge carrier distribution. Further embodiments provide a semiconductor component, which has a high efficiency of radiation generation or radiation reception.

Embodiments provide, a method for producing an electrical contact with a semiconductor layer.

According to at least one embodiment of the method, a semiconductor layer is provided. For example, the semiconductor layer is a p-conducting or n-conducting doped semiconductor layer intended for the production of an optoelectronic semiconductor component, such as a radiation emitter or radiation receiver.

According to at least one embodiment of the method, a plurality of contact rods are formed on the semiconductor layer. The contact rods are thus arranged outside the semiconductor layer. Expediently, the contact rods are free of semiconductor material, in particular, over their entire vertical extension. The contact rods are formed expediently to be electrically conductive and electrically connected to the semiconductor layer. For example, the contact rods are metallic or contain at least one metal.

The contact rods can be directly adjacent to the semiconductor layer. Alternatively, a particularly electrically conductive intermediate layer can be arranged between the contact rods and the semiconductor layer. For example, the contact rods are arranged next to one another along a lateral direction, i.e., a direction that runs parallel to a main extension plane of the semiconductor layer, and are at least partially spaced apart from one another. The term "contact rod" does not imply any limitation with regard to the basic geometric shape of the base area of the contact rod. The base area of the contact rods can be polygonal, for example, triangular, square or hexagonal, or completely or at least partially curved, for example, circular or elliptical. Furthermore, the vertical extension, i.e., the extension of the contact rods perpendicular to the main extension plane of the semiconductor layer, is not necessarily greater than the maximum lateral extension of the contact rods. Furthermore, the cross-section of the contact rods can be constant or vary along the vertical direction.

According to at least one embodiment of the method, a filling layer is formed. For example, the filling layer directly adjoins the semiconductor layer in places or, where appropriate, the intermediate layer. In particular, the filling layer is formed in intermediate spaces between the contact rods. For example, the filling layer completely fills the intermediate spaces between the contact rods. For example, the filling layer immediately adjoins the contact rods. Furthermore, the filling layer can also be formed on the contact rods. For example, the filling layer is applied in such a way that it completely covers at least two adjacent contact rods and the intermediate space between the contact rods. The filling layer can also completely cover all contact rods.

In particular, the filling layer may have a greater maximum extension in the vertical direction than the contact rods.

According to at least one embodiment of the method, the contact rods are exposed. For example, material of the filling layer, in particular material of the filling layer arranged on one side of the contact rods facing away from the semiconductor layer, is removed. The removal is carried out, for example, by a chemical and/or mechanical process, such as etching, polishing or chemical-mechanical polishing. After completion of the exposure, the contact rods extend completely through the filling layer in the vertical direction. After the contact rods have been exposed, the filling layer and the contact rods terminate flush on the side facing away from the semiconductor layer, for example.

According to one embodiment of the method for producing an electrical contact with a semiconductor layer, the semiconductor layer is provided. A plurality of contact rods are formed on the semiconductor layer. A filling layer is formed on the contact rods and in the intermediate spaces between the contact rods. The contact rods are exposed.

According to at least one embodiment of the method, a contact layer is applied after the contact rods have been exposed, which connects at least some of the contact rods electrically conductively to one another. Expediently, the contact layer is formed electrically conductive. In particular, the contact layer covers all contact rods on the side facing away from the semiconductor layer.

The contact layer can be single-layered or multi-layered. For example, the contact layer or a partial layer of the contact layer facing the semiconductor layer is formed as a mirror layer. For example, the mirror layer has silver, aluminum, rhodium, nickel or chrome. These materials have a high reflectivity in the visible spectral range. In the infrared spectral range, for example, gold has a high reflectivity.

According to at least one embodiment of the method, the contact rods are formed by means of a first material and a second material, wherein the first material is applied to the semiconductor layer and the second material is applied to the first material.

In particular, a thickness of the second material may be greater than a thickness of the first material. For example, the thickness of the second material is at least five times greater, preferably at least ten times greater, than the thickness of the first material. The second material may be arranged on the side of the first material remote from the semiconductor layer or between the semiconductor layer and the first material.

According to at least one embodiment of the method, the first material is structured according to a given lateral structure. For example, the first material is applied over a large area in the form of a layer and subsequently patterned photolithographically. Alternatively, the semiconductor layer can, for example, be partially covered with a mask layer with a material that is not to be covered with the first material. After the application of the first material, the mask layer can be removed together with the first material arranged on it so that the first material has the desired lateral structure.

According to at least one embodiment of the method, a lateral structure of the first material is self-organized. A structuring, for example, by means of a photolithographic process, is therefore not necessary.

A self-organized lateral structure allows particularly small lateral structures to be achieved. For example, a maximum lateral extension of a structural element is below the resolution limit of lithography methods.

According to at least one embodiment of the method, the first material is applied in the form of clusters. For example, the clusters are metallic clusters. For example, the clusters contain gold.

A lateral extension of the clusters can subsequently be reduced so that the clusters are laterally spaced apart from one another at least in places. This can be done, for example, by dry chemical etching. For example, the individual clusters have a lateral extension between 100 nm and 1 µm.

After reducing the lateral extension, the individual clusters may, for example, have a lateral extension between 30 nm and 100 nm.

According to at least one embodiment of the method, the second material is applied by electrodeposition. Electrodeposition has a high deposition rate, in particular in comparison to other deposition processes such as sputtering or evaporation. Furthermore, the deposition only takes place at places, where the first material is located. The thickness of the contact rods to be produced can be adjusted by the duration of the electrodeposition process.

According to at least one embodiment of the method, the second material is formed by a crystal growth proceeding from the first material. This can be done, for example, based on the VLS (Vapor Liquid Solid) mechanism. The second material can, for example, be applied by catalyst-assisted chemical vapor deposition. In this process, monocrystalline or multicrystalline contact rods can be formed. Such crystal rods are also called "whiskers". This growth takes place self-adjusted only at the places where the first material is located.

For example, the second material of the contact rods can form between the first material and the semiconductor layer. The first material can act as a catalyst. With increasing duration of the process, the first material is moving away from the semiconductor layer in the vertical direction.

According to at least one embodiment of the method, an intermediate layer is applied to the semiconductor layer before the contact rods are formed. The contact rods can then be applied to the intermediate layer. For example, the intermediate layer contains a TCO material.

TCO materials are transparent conductive materials, usually metal oxides such as zinc oxide, tin oxide, cadmium oxide, titanium oxide, indium oxide or indium tin oxide (ITO). In addition to binary metal oxygen compounds such as $ZnO$, $SnO_2$ or $In_2O_3$, ternary metal oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conducting oxides also belong to the group of TCOs. Furthermore, the TCOs do not necessarily correspond to a stoichiometric composition and can also be p- or n-doped.

The intermediate layer can fulfil the function of a current spreading layer. Such an intermediate layer is particularly suitable for a semiconductor layer with very low transverse conductivity, e.g., p-conductive semiconductor material based on nitride compound conductor material.

Based on "nitride compound semiconductors" in the present context means that the semiconductor layer, for example, as part of a semiconductor layer sequence having an active region for radiation generation or radiation reception, comprises or consists of a nitride compound semiconductor material, preferably $Al_xIn_yGa_{1-x-y}N$, wherein $0 \le x \le 1$, $0 \le y \le 1$ and $x+y \le 1$. This material does not necessarily have to have a mathematically exact composition according to the above formula. Rather, it may, for example, contain one or more dopants and additional components. For simplicity's sake, however, the above formula contains only the substantial components of the crystal lattice (Al, Ga, In, N), even if these may be partially replaced and/or supplemented by small quantities of other substances.

According to at least one embodiment of the method, the filling layer contains a dielectric material. The filling layer, for example, fulfils the function of a dielectric mirror. In the simplest case, the filling layer has a single layer. Alternatively, the filler layer comprises a plurality of dielectric layers, wherein adjacent layers have different refractive indices. For example, a Bragg mirror is formed by means of the dielectric layers.

According to at least one embodiment of the method, the filling layer contains a TCO material. In particular, the filling layer may have a sublayer and a further sublayer, wherein the sublayer contains a dielectric material and the further sublayer contains a TCO material. Expediently, the further sublayer is arranged closer to the semiconductor layer than the sublayer. In particular, the further sublayer directly adjoins the semiconductor layer or, where appropriate, the intermediate layer. The sublayer and/or the further sublayer can also be formed multi-layered.

A filling layer containing a TCO material can contribute to current spreading. Dielectric materials, on the other hand, can have a particularly high transparency in the visible spectral range.

The following effects can in particular be achieved with the method described.

A plurality of contact rods can be formed, each of which can have a small lateral extension, so that despite the plurality of contact rods, the semiconductor layer to be contacted is only slightly shaded overall. A filling layer can be introduced between the contact rods, which itself does not have to be electrically conductive, so that the material of the filling layer can be selected with regard to the lowest possible radiation absorption in the spectral range relevant for the semiconductor component to be produced, for example, in the visible, ultraviolet of the infrared spectral range.

In particular in comparison with a method in which a dielectric layer is firstly applied to the semiconductor layer and subsequently, through-holes are formed through the dielectric layer, the contact rods can be arranged very close to one another and with a high density. Requirements on the electrical transverse conductivity of a current spreading layer outside the semiconductor layer can thus be reduced. With the same thickness of a current spreading layer, such as an intermediate layer in the form of a TCO layer, a higher current density can be homogeneously distributed over the semiconductor component. Alternatively, a thinner intermediate layer can be used for a constant current density. Losses of brightness due to absorption in the intermediate layer can thus be reduced.

Due to the high number of contact rods, the current flowing over the individual contact rods is comparatively low. For the contact rods, a material with a lower electrical conductivity, such as a TCO material, is therefore suitable in addition to a metal. Absorption losses can thus be further reduced.

The method can be particularly suitable for producing the electrical contact of semiconductor material, which itself exhibits a comparatively low electrical conductivity, for example, p-conductive doped semiconductor material based on nitride compound semiconductors.

However, the method is also suitable for other semiconductor materials, in particular other III-V compound semiconductors or also for n-conductive semiconductor material based on nitride compound semiconductors.

The method can also be suitable for producing the electrical contacts of a plurality of semiconductor components which are not formed for the generation of radiation but for the reception of radiation, for example, solar cells or photodetectors.

A semiconductor component has an electrical contact according to at least one embodiment, wherein the electrical contact is arranged on a semiconductor layer and comprises a plurality of contact rods. Intermediate spaces between the contact rods are filled with a filling material. The contact rods are electrically conductively connected to one another via a contact layer, in particular on a side facing away from the semiconductor layer.

For example, the semiconductor component is formed as an optoelectronic semiconductor component, in particular as a luminescent diode, a photodetector or a solar cell.

According to at least embodiment of the semiconductor component, the contact rods have a density of at least 10,000 pieces per square millimeter at least in places. The higher the density, the lower the current flowing over the individual contact rods can be, so that the requirements on the current carrying capacity of the individual contact rods are reduced.

An average distance between adjacent contact rods is preferably between 300 nm and 10 μm, inclusive.

A maximum lateral extension of the contact rods is preferably between 3% and 20%, inclusive of the mean distance between adjacent contact rods. Thus, comparatively many contact rods can be applied to the semiconductor layer without leading to a significant covering of the semiconductor layer by contact rods. Absorption losses caused by the contact rods are minimized while the electrical contactability of the semiconductor layer is good.

Particularly small distances between the contact rods can be achieved by means of a self-organized arrangement of the contact rods. For example, the mean distance between adjacent contact rods is between 300 nm and 1 μm, inclusive. For example, the contact rods have a density of at least 1 million per square millimeter at least in places.

A maximum lateral extension of the contact rods is preferably between 30 nm and 1000 nm, inclusive. In particular, in the case of self-organized contact rods, the contact rods can have a maximum lateral extension between 30 nm and 100 nm, inclusive.

The method described above for producing an electrical contact is particularly suitable for producing the semiconductor component according to embodiments. Features disclosed in the context of the method can therefore also be used for the semiconductor component and vice versa.

BRIEF DESCRIPTION OF THE DRAWINGS

Further embodiments and expediencies result from the following description of the exemplary embodiments in connection with the figures.

They show:

FIGS. 1A to 1F are exemplary embodiments of a method using intermediate steps shown in sectional views and top views;

FIGS. 3A to 3F are exemplary embodiments of a method using intermediate steps shown in sectional views and top views;

Figure 2A:
FIGS. 2A to 2E are exemplary embodiments of a method using intermediate steps shown in sectional views and top views.
Figure 2B:
Figure 2C:
Figure 2D:
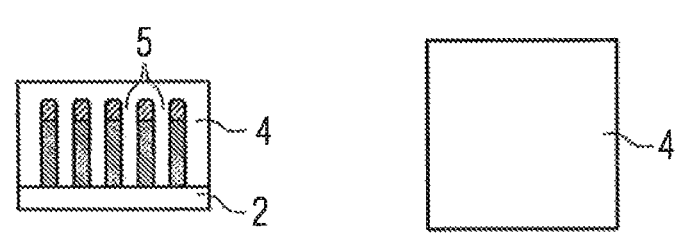
Figure 2E:
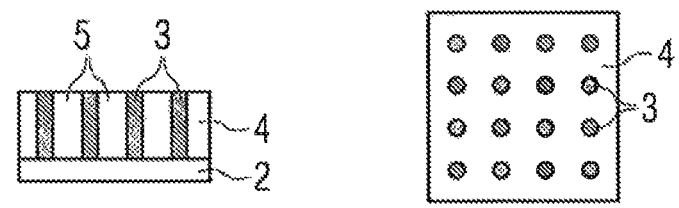

Same, similar or similar acting elements are provided with the same reference signs in the figures.

The figures are schematic representations and therefore not necessarily true to scale. Rather, comparatively small elements and, in particular, layer thicknesses can be displayed exaggeratedly large for clarification.

DETAILED DESCRIPTION OF ILLUSTRATIVE EMBODIMENTS

FIGS. 1A to 1F show an exemplary embodiment of a method for producing an electrical contact, wherein the figures each show a sectional view and an associated plan view.

A material layer 310 is applied to a semiconductor layer 2 to be electrically contacted (FIG. 1A). The material layer contains a metal, for example, nickel. The material layer directly adjoins the semiconductor layer 2.

The material layer 310 is subsequently structured so that a first material 31 is present in laterally structured form on the semiconductor layer 2 (FIG. 1B). For example, the first material 31 is present in the form of a regular rectangular grid or hexagonal grid. The structuring can, for example, be done by means of lithography, for example, by means of a stepper, and subsequent etching of the regions of the material layer to be removed. For example, the individual regions of the first material are circular.

Deviating from this, the first material 31 can also be applied to the semiconductor layer in structured form. For this purpose, the second semiconductor layer can be covered by a mask layer in regions not to be coated and the mask layer can be coated with the material layer 310. By removing the mask layer and the material of the material layer 310 arranged on it, the first material is formed in structured form.

Subsequently, as shown in FIG. 1C, a second material 32 is formed on the first material. For this purpose, electrodeposition is suitable, for example. By means of electrodeposition, relatively large layer thicknesses can be produced comparatively quickly. In addition, the deposition only takes place at the regions where the first material 31 is already present. The second material contains a metal, such as nickel. In vertical direction, the extension of the second material 32 is greater than the extension of the first material 31, for example, at least five times greater.

Subsequently, as shown in FIG. 1D, intermediate spaces 5 between the contact rods 3 are filled with a filling layer 4, in particular completely, for example, by sputtering or vapor deposition. The contact rods 3 on the side facing away from the semiconductor layer 2 are also covered.

The contact rods 3 are exposed, for example, by a chemical, mechanical or chemo-mechanical removal process, for example, by polishing, etching or chemo-mechanical polishing. For this purpose, the material of the filling layer 4 is preferably removed over a large region, in particular over the entire surface, until the contact rods 3 are exposed (FIG. 1E). During this step, a part of the contact rods can also be removed. This makes it easy to ensure that the contact rods extend completely through the filler layer.

The contact rods 3 formed in this way are metallic. In particular, the contact rods comprise the first material 31 and the second material 32, the first material and the second material each comprising or consisting of a metal.

On the side of the contact rods 3 facing away from the semiconductor layer 2, a contact layer 35 is applied, for example, by sputtering or vapor deposition. The contact layer connects the individual contact rods in an electrically conductive way with one another. For example, the contact layer 35 directly adjoins the contact rods 3.

The material of filling layer 4 can be electrically conductive or electrically insulating. The filling layer preferably contains a dielectric material, such as an oxide, such as silicon oxide, a nitride, such as silicon nitride, or an oxynitride, such as silicon oxynitride. The filling layer can also be formed multi-layered.

For example, the filling layer may have a plurality of dielectric layers, wherein adjacent layers each have different refractive indices from one another, so that the filling layer forms a dielectric mirror in the form of a Bragg mirror. In the simplest case, a single dielectric layer can form a dielectric mirror. Particularly in combination with a contact layer 35 formed as a mirror layer, an electrical contact of the semiconductor layer can be achieved, which has low absorption losses and a high reflectivity.

A distance between adjacent contact rods 3, for example, is between 3 µm and 10 µm, inclusive. A maximum lateral extension of the contact rods, for example, is between 300 nm and 1 µm, inclusive. The maximum lateral extension of the contact rods is preferably between 5% and 20%, inclusive of the contact rod spacing. In this way it can be achieved in a simplified way that only a comparatively small region of the semiconductor layer 2 is covered by the contact rods and at the same time a homogeneous current distribution in the lateral direction can take place in the semiconductor layer 2.

A vertical extension of the contact rods, for example, is between 200 nm and 1.5 µm, inclusive. In particular, the vertical extension is preferably between 0.3 times and three times the peak wavelength of the radiation to be generated. The vertical extension of the contact rods 3 depends in particular on the thickness of the filling layer 4 to be produced. For example, the filling layer may have a smaller thickness in a single-layer design than in a multi-layer design in which the filling layer forms a dielectric mirror, for example, in the form of a Bragg mirror, with high reflectivity.

A further exemplary embodiment of a method is shown schematically in FIGS. 2A to 2E using intermediate steps. This exemplary embodiment corresponds substantially to the exemplary embodiment described in connection with FIGS. 1A to 1F. In contrast to this, the first material 31 is applied in a self-organized manner. As shown in FIG. 2A, cluster 311, in particular metallic clusters, are applied to the semiconductor layer 2 for this purpose. For simplified representation, the clusters in FIG. 2A are arranged in a regular hexagonal grid. However, the arrangement of the clusters is self-organized, so that the mean distances between neighboring clusters differ from one another and there is no regular arrangement of the clusters. For example, the clusters are metal nanoclusters, such as gold nanoclusters.

Subsequently, the lateral extension of cluster 311 is reduced so that the remaining material of at least some neighboring clusters is spaced apart from one another. A distance between the individual partial regions of the first material 31 and thus between the contact rods produced later is preferably between 300 nm and 1 µm, inclusive.

After reducing the lateral extension, an extension of the first material is preferably between 30 nm and 100 nm, inclusive.

Proceeding from the first material 31, a second material 32 is applied. The second material can be deposited by a crystal growth process, for example, based on the VLS mechanism. The second material grows between the first material 31 and the semiconductor layer 2, so that the first material 31 moves further away from the semiconductor layer 2 with increasing growth time. The growth occurs self-adjusted only in places, where the first material 31 is located. The growth is carried out until the contact rods formed have at least a length corresponding to the thickness of the dielectric mirror to be produced.

The second material 32, for example, contains a metal or a metal oxide, such as a TCO material.

The further method steps, in particular the filling of the intermediate spaces to produce the dielectric mirror, the exposure of the contact rods and the application of a contact layer can be carried out as described in connection with FIGS. 1D to 1F.

When the contact rods 3 are exposed, the first material 31, in particular can be completely removed (FIG. 2E), so that the first material is no longer present in the finished contact rods. An interface within the contact rods between the first material and the second material 32 can thus be avoided, although both the first material and the second material are used to manufacture the contact rods. Deviating from this, the material removal can also be stopped earlier when the contact rods are exposed, so that at least a part of the first material remains in the contact rods.

By means of the self-organized configuration of the contact rods 3 described, in particular in comparison to the formation of contact rods by means of a lithographic process, particularly small lateral extensions of the contact rods and small distances between the contact rods can be achieved.

The exemplary embodiment shown in FIGS. 3A to 3F substantially corresponds to the exemplary embodiment described in connection with FIGS. 1A to 1F. In contrast to this, the contact rods 3 are not formed directly on the semiconductor layer 2. Before the contact rods are formed, an intermediate layer 6 is applied to the semiconductor layer 2, as shown in FIG. 3A. For example, a TCO material such as indium tin oxide (ITO) or zinc oxide is suitable for the intermediate layer.

As shown in FIGS. 3B and 3C, a first material 31 is applied to the intermediate layer 6, followed by a second material 32 (FIG. 3D). These steps as well as the subsequent filling of the intermediate spaces and exposure of the contact rods and the application of the contact layer can be carried out as described in connection with FIGS. 1A to 1F. Such an intermediate layer is, of course, also suitable for the other exemplary embodiments described in this application.

By means of the intermediate layer 6, the lateral current distribution in the semiconductor layer 2 can be further improved. Compared to a current spreading layer that is not electrically connected to a plurality of contact rods 3, the requirements for the electrical conductivity of the intermediate layer 6 are lower. For the same current densities, a smaller thickness of the intermediate layer or a material that has a lower electrical conductivity but a higher radiation permeability is therefore sufficient. Alternatively, with the same thickness of the intermediate layer, a higher current density can be introduced into the semiconductor layer 2 due to the contact rods 3.

For example, the interlayer 6 has a thickness between 3 nm and 20 nm, inclusive.

Figure 4A:
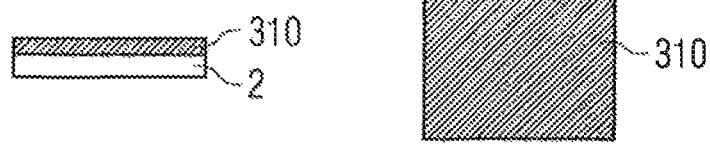
FIGS. 4A to 4F show exemplary embodiments of a method using intermediate steps shown in sectional views and top views.
Figure 4B:
Figure 4C:
Figure 4D:
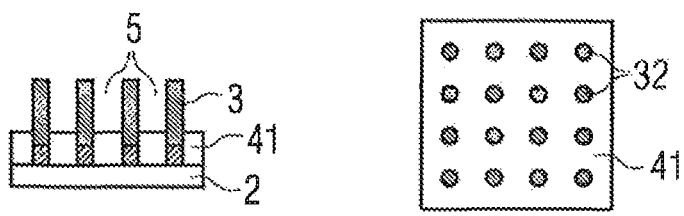
Figure 4E:
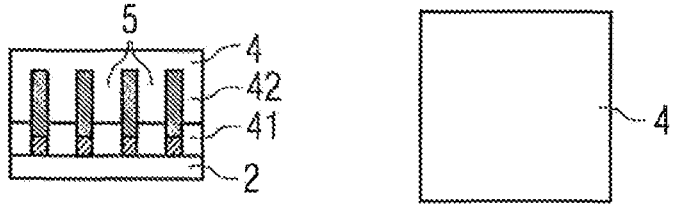
Figure 4F:
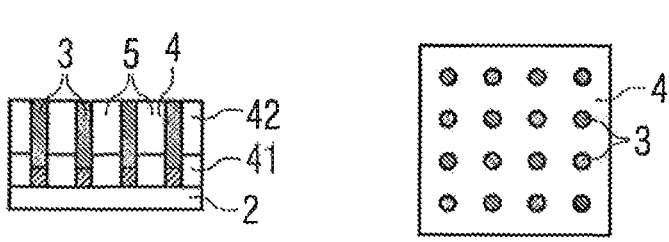

The exemplary embodiment shown in FIGS. 4A to 4F substantially corresponds to the exemplary embodiment described in connection with FIGS. 1A to 1F. In contrast to this, the filling layer 4 has a sublayer 42 and a further sublayer 41. The further sublayer 41 is located closer to the semiconductor layer 2 and is applied in such a way that the contact rods 3 protrude beyond the filling layer in the vertically direction (FIG. 4D). The intermediate spaces 5 are completely filled only by means of the sublayer 42.

The further method steps and in particular the application of a contact layer 35 can be carried out as described in connection with FIGS. 1A to 1F. By means of the filling layer 4, which contains a TCO material, the filling layer itself can contribute to improved lateral current distribution in the semiconductor layer 2. A thickness of the further sublayer 41, for example, is between 3 nm and 20 nm, inclusive. The greater the layer thickness, the greater the transverse conductivity of the further sublayer 41. At the same time, however, the radiation absorption also increases with the same total thickness of the filler layer 4, since TCO materials typically have a higher absorption than dielectric materials. Such a filling layer with a TCO material and a dielectric material can also be used in the other exemplary embodiments.

Figure 5A:
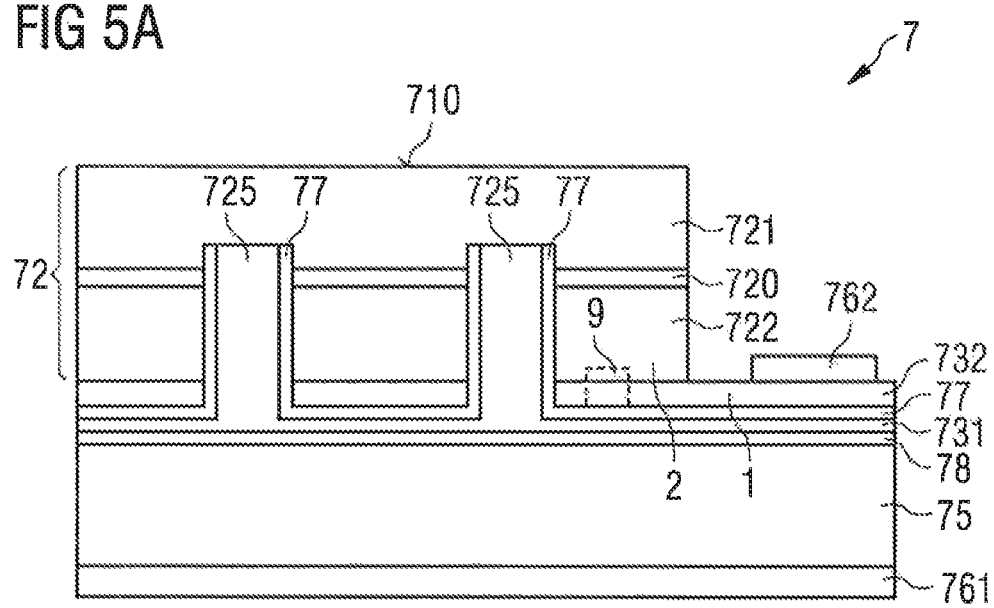
FIG. 5A is an exemplary embodiment for a semiconductor component in a schematic sectional view.
Figure 5B:
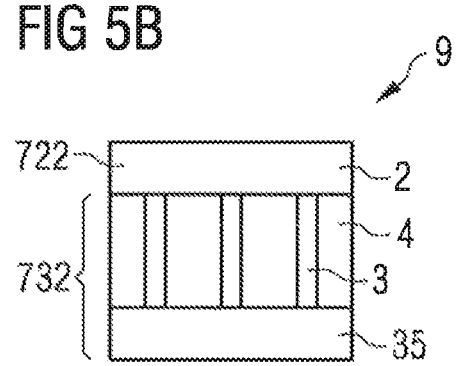
FIG. 5B is an exemplary embodiment for a semiconductor component in an enlarged representation of a section.

FIGS. 5A and 5B show an exemplary embodiment of a semiconductor component 7 in the form of a semiconductor chip with an electrical contact 1. FIG. 5B shows an enlarged view of a section 9 of FIG. 5A. The semiconductor component 7 is intended, for example, as a luminescent diode, in particular as a light-emitting diode for generating radiation in the visible, ultraviolet or infrared spectral range. Alternatively, the semiconductor component can also be formed as a radiation detector or as a solar cell.

The semiconductor component 7 comprises a semiconductor layer sequence 72 having a radiation generating active region 720, a first semiconductor layer 721, and a second semiconductor layer 722. For example, the second semiconductor layer is 722 p-conductive and the first semiconductor layer is 721 n-conductive or vice versa.

The first semiconductor layer 721 is electrically connected to a first electrical contact 761 via a first connection layer 731. The second semiconductor layer 722 is electrically connected to a second electrical contact 762 via a second connection layer 732. By applying an external electrical voltage between the first electrical contact 761 and the second electrical contact 762, charge carriers can be injected from different sides into the active region and recombine there under emission of radiation. In the case of a radiation receiver or a solar cell, the charge carriers generated in the active regions by separation of electron-hole pairs can be transferred away from the semiconductor component 7 via contacts 761, 762.

The electrical contact 1, which can be produced as described in particular in connection with the preceding exemplary embodiments, serves for electrical contact of the second semiconductor layer 722. The electrical contact 1 is formed by the second connection layer 732 and has, as described in connection with the preceding exemplary embodiments, a plurality of contact rods 3. The contact rods 3 are electrically conductively connected to a contact layer 35 on the side facing away from the semiconductor layer 2. A filling material 4 is arranged between the contact rods 3.

By means of the electrical contact 1, charge carriers can be efficiently injected into the second semiconductor layer 722 via the second electrical contact 762. At the same time, the electrical contact can have a high reflectivity, so that radiation generated in the active region 720 and radiated in the direction of the carrier 75, on which the semiconductor layer sequence 72 is arranged, can be deflected in the direction of a radiation-transmitting surface 710 of the semiconductor component and exit from this.

The first semiconductor layer is electrically contacted via one or more recesses 725, which extend through the second semiconductor layer 722 and the active region 720 into the first semiconductor layer 721. To avoid an electrical short circuit of the first connection layer 731 with the second semiconductor layer 722, a side surface of the recess 725 is covered with an insulation layer 77, for example, an oxide layer.

In the exemplary embodiment shown, the carrier 75 is different from a growth substrate for the semiconductor layer sequence 72, and the semiconductor layer sequence is attached to the carrier by means of a bonding layer 78. Of course, the described electrical contact 1 is also suitable for semiconductor components, in which the carrier 75 is the growth substrate of the semiconductor layer sequence. The arrangement of the electrical contacts can also be varied within wide limits.

The electrical contact is particularly suitable for a p-contact semiconductor layer to be electrically contacted, in particular for a p-conducting semiconductor layer based on nitride compound semiconductor material, since such semiconductor layers have a comparatively low electrical conductivity. In principle, however, the electrical contact is also suitable for other semiconductor layers, in particular n-conducting semiconductor material or other compound semiconductor material.

The invention is not limited by the description on the basis of the exemplary embodiments. Rather, the invention includes each new feature as well as the combination of features, which includes in particular for each combination of features in the claims, even if this feature or combination itself is not explicitly specified in the claims or the exemplary embodiments.

The invention claimed is:

1. A method for producing an electrical contact on a semiconductor layer, the method comprising:
   providing the semiconductor layer;
   forming a plurality of contact rods on the semiconductor layer, wherein the contact rods are formed by a first material and a second material, wherein the first material is applied to the semiconductor layer and the second material is applied to the first material, and wherein a lateral structure of the first material is self-organized;

forming a filling layer on the contact rods and in intermediate spaces between the contact rods; and exposing the contact rods.

2. The method according to claim 1, further comprising applying an intermediate layer to the semiconductor layer prior to forming the plurality of contact rods, wherein the contact rods are applied to the intermediate layer.

3. The method according to claim 1, further comprising applying a contact layer to the contact rods so that at least some of the exposed contact rods are electrically conductively connected to one another.

4. The method according to claim 1, wherein the first material is structured according to a given lateral structure.

5. The method according to claim 1, wherein forming the first material comprises applying the first material in clusters and reducing a lateral extension of the clusters before the second material is formed, so that the clusters are laterally spaced apart from one another at least in places.

6. The method according to claim 1, wherein forming the second material comprises applying the second material by electrodeposition.

7. The method according to claim 1, wherein forming the second material comprises performing crystal growth proceeding from the first material.

8. The method according to claim 1, wherein the filling layer comprises a dielectric material.

9. The method according to claim 1, wherein the filling layer contains a TCO material.

10. The method according to claim 1, wherein the filling layer comprises a first sublayer and a second sublayer, and wherein the first sublayer comprises a dielectric material and the second sublayer comprises a TCO material.

11. A semiconductor component produced by the method according to claim 1.

12. A semiconductor component comprising:
an electrical contact arranged on a semiconductor layer, wherein the contact comprises a plurality of contact rods, wherein intermediate spaces between the contact rods are filled with a filler material,
wherein the contact rods are electrically conductively connected to one another on a side facing away from the semiconductor layer via a contact layer, and
wherein the contact rods have a density of at least 1,000,000 pieces per $mm^2$ at least in places.

13. The semiconductor component according to claim 12, wherein the contact rods are not arranged regularly in lateral direction.

14. The semiconductor component according to claim 12, wherein distances between neighboring contact rods differ from one another.

15. The method according to claim 1, wherein the second material grows between the first material and the semiconductor layer.

16. A method for producing an electrical contact on a semiconductor layer, the method comprising:
providing the semiconductor layer;
forming a plurality of contact rods on the semiconductor layer, wherein the contact rods are formed by a first material and a second material, wherein the first material is applied to the semiconductor layer and the second material is applied to the first material, wherein the second material grows between the first material and the semiconductor layer, and wherein a lateral structure of the first material is self-organized;
forming a filling layer on the contact rods and in intermediate spaces between the contact rods; and
exposing the contact rods.

* * * * *